(12) United States Patent
Shin et al.

(10) Patent No.: US 9,291,845 B2
(45) Date of Patent: Mar. 22, 2016

(54) MOBILE TERMINAL AND METHOD FOR MANUFACTURING THE SAME

(71) Applicant: LG Electronics Inc., Seoul (KR)

(72) Inventors: Minchul Shin, Seoul (KR); Minho Park, Seoul (KR); Sukho Hong, Seoul (KR); Dongyoup Han, Seoul (KR); Jongseok Park, Seoul (KR); Hyunghoon Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/487,996

(22) Filed: Sep. 16, 2014

(65) Prior Publication Data

US 2015/0261033 A1  Sep. 17, 2015

(30) Foreign Application Priority Data

Mar. 17, 2014  (KR) .................. 10-2014-0031322

(51) Int. Cl.
| | |
|---|---|
| G02F 1/1333 | (2006.01) |
| G06F 1/16 | (2006.01) |
| H04M 1/02 | (2006.01) |
| H05K 5/00 | (2006.01) |
| H05K 5/02 | (2006.01) |

(52) U.S. Cl.
CPC ........ *G02F 1/133308* (2013.01); *G06F 1/1637* (2013.01); *H04M 1/0266* (2013.01); *H04M 1/0268* (2013.01); *H05K 5/0086* (2013.01); *H05K 5/0217* (2013.01); *G02F 2001/13332* (2013.01); *G02F 2001/133331* (2013.01); *Y10T 29/49826* (2015.01)

(58) Field of Classification Search
CPC .................. G02F 1/133308; G02F 1/133608
See application file for complete search history.

(56) References Cited

U.S. PATENT DOCUMENTS

| | | | |
|---|---|---|---|
| 8,462,289 B2 | 6/2013 | Nishizawa et al. | |
| 2009/0015747 A1 | 1/2009 | Nishizawa et al. | |
| 2013/0321740 A1* | 12/2013 | An et al. .................. | 349/58 |

FOREIGN PATENT DOCUMENTS

| | | |
|---|---|---|
| EP | 1191411 A2 | 3/2002 |
| EP | 1220017 A1 | 7/2002 |
| JP | 2009-020168 A | 1/2009 |
| KR | 10-2014-0021928 A | 2/2014 |

* cited by examiner

*Primary Examiner* — Phu Vu
(74) *Attorney, Agent, or Firm* — Birch, Stewart, Kolasch & Birch, LLP

(57) ABSTRACT

Provided is a mobile terminal including: a window disposed on a surface of a terminal body and formed to be curved; a liquid crystal display (LCD) disposed on a rear surface of the window and configured to output visual information through the window; and a frame formed in a curved shape and including a window mounting portion, on which the window is mounted and to which at least part of the window is coupled. The frame accommodates the display therein, and is configured to apply a bending force to conform the window to the curved shape of the frame and to cause the conformed window to bend the LCD when the window is attached to the frame.

14 Claims, 13 Drawing Sheets

MOBILE TERMINAL AND METHOD FOR MANUFACTURING THE SAME

CROSS-REFERENCE TO RELATED APPLICATION

This application claims the benefit of and priority to Korean Application No. 10-2014-0031322, filed on Mar. 17, 2014, which is incorporated herein by reference for all purposes as if fully set forth herein.

BACKGROUND OF THE DISCLOSURE

1. Field of the Disclosure

This specification relates to a mobile terminal with a display unit in a curved shape.

2. Background of the Disclosure

Terminals may be divided into mobile/portable terminals and stationary terminals according to their mobility. Also, the mobile terminals may be classified into handheld terminals and vehicle mount terminals according to whether or not a user can directly carry.

Mobile terminals (or electronic devices) may be configured to perform various functions, for example, data and voice communication, capturing images or video, storing voice, reproducing music files via a speaker system, displaying images or video and the like. Some of mobile terminals may include an additional function of playing electronic games, and other mobile terminals may be implemented as multimedia players. In addition, in recent times, mobile terminals can receive multicast signals to allow viewing of visual contents, such as broadcasting, video or television programs.

As it becomes multifunctional, a mobile terminal can be allowed to capture still images or moving images, play music or video files, play games, receive broadcast and the like, so as to be implemented as an integrated multimedia player.

Furthermore, many efforts are undergoing to support or enhance various functions of such mobile terminals. Such many efforts include changes and improvement of structural components implementing a mobile terminal and/or software or hardware improvement.

In view of the improvements of the structural components, mobile terminals are evolving into various design shapes. Accordingly, a mobile terminal with a display unit in a curved shape is attracting attention. In response to such attention to the curved display unit, active researches on a device structure focusing on the curved display unit are undergoing.

SUMMARY OF THE DISCLOSURE

Therefore, an aspect of the detailed description is to provide a structure capable of realizing the conventional flat display unit into a curved display unit.

Another aspect of the detailed description is to provide a novel device structure, focusing on a curved display unit.

To achieve these and other advantages and in accordance with the purpose of this specification, as embodied and broadly described herein, there is provided a mobile terminal including a window that is disposed on one surface of a terminal body and formed to be curved, a display that is provided on a rear surface of the window and configured to output visual information through the window, and a frame that has a window mounting portion, on which the window is mounted and to which at least part of the window is coupled, and configured to accommodate the display therein, wherein a mounting surface of the window mounting portion, to which the window is coupled, may be formed in a curved shape, so as to generate a bending force making the window curved.

In accordance with one exemplary embodiment, the window mounting portion may include a first mounting surface and a second mounting surface respectively corresponding to both end portions of the window in a lengthwise direction of the window, and the first and second mounting surfaces may be formed to have the same curvature.

Bonding layers may be disposed between the window and the first mounting surface and between the window and the second mounting surface, respectively, such that the window maintains the curved shape while being coupled to the first and second mounting surfaces.

Each of the bonding layers may be affected by a tensile force, which is applied in a direction that the window is separated from the window mounting surface, in response to the window being coupled to the first and second mounting surfaces.

The display may be attached on the rear surface of the window so as to be curved, in response to the window being curved.

The frame may further include a display mounting portion that extends from the window mounting portion to cover a rear surface of the display.

The display mounting portion may be formed in a curved shape to correspond to the display which is curved in response to the window being curved.

Or, the frame may include a hollow portion that is surrounded by the window mounting portion to form a space accommodating the display therein. The frame may be coupled with a printed circuit board, which is disposed to cover the rear surface of the display, reinforces rigidity of the frame such that a bending force to make the window curved is maintained, and has electronic elements mounted thereon.

An adhesive layer for adhering the display on the printed circuit board may be provided between the display and the printed circuit board.

Or, the mobile terminal may further include a reinforcing member that is coupled to the frame to cover a hollow portion of the frame surrounded by the window mounting portion, such that the rear surface of the display accommodated in the hollow portion is covered thereby, and configured to reinforce rigidity of the frame such that the bending force to make the window curved is maintained.

The frame may be formed of synthetic resin. Also, the reinforcing member may be formed of a metal and integrally coupled to the frame by insert injection.

The reinforcing member may be formed in a curved shape to correspond to the display which is curved in response to the window being curved.

The mobile terminal may further include a printed circuit board that is coupled to the frame to cover a rear surface of the reinforcing member, and configured to reinforce rigidity of the frame along with the reinforcing member.

The frame may further include hooks that are disposed to cover a rear surface of the printed circuit board so as to fix the printed circuit board.

A heat diffusion sheet may be disposed between the reinforcing member and the printed circuit board to diffuse heat generated from the printed circuit board to the reinforcing member.

Bosses inserted through holes of the printed circuit board may protrude from the rear surface of the reinforcing member, such that the printed circuit board is restricted from being moved in a radial direction of the bosses.

Coupling members may be coupled to the bosses to cover the printed circuit board, such that the printed circuit board is prevented from being separated in an axial direction of the bosses.

The mobile terminal may further include a case that is disposed to cover the printed circuit board and has a coupling hole corresponding to each boss, and a coupling member that is coupled to the boss through the coupling hole and configured to couple the case and the reinforcing member to each other.

In accordance with another exemplary embodiment, the mobile terminal may further include shape-preserving members that are disposed at both sides of the window in a widthwise direction of the window, respectively, and extend along a lengthwise direction of the window. The shape-preserving members may be formed in a curved shape to correspond to the window mounting surface.

Each of the shape-preserving members may include a first portion that is coupled to the window mounting surface, and a second portion that is bent from the first portion to reinforce rigidity of the first portion, and disposed to face a side surface of the display.

The second portion may be coupled to the frame by hooks or screws.

In accordance with another exemplary embodiment, the mobile terminal may further include an appearance-forming member that is coupled to the frame to surround an outer circumference of the frame and disposed to cover side surfaces of the window, so as to form a side appearance of the terminal body. Here, the appearance-forming member may be formed in a curved shape to reinforce rigidity of the frame.

Protrusions may be formed at both sides of the frame in a widthwise direction of the frame and extend into a curved shape along a lengthwise direction of the frame, and stopping slots may be formed on an inner side surface of the appearance-forming member corresponding to the protrusions.

In accordance with another exemplary embodiment, the display may be a liquid crystal display (LCD).

A method for fabricating a mobile terminal according to one embodiment of the present disclosure may include preparing a display unit having a window and a display; and coupling the display unit to the frame. Here, one of the display unit and the frame may be fabricated in a curved shape or changed into a curved shape by an external force. The other of the display unit and the frame may be coupled to the curved one so as to be changed into the curved shape.

The frame may include a window mounting portion to which at least part of the window is coupled, and a mounting surface of the window mounting portion, to which the window is coupled, may be formed in a curved shape, so as to generate a bending force making the window curved.

The display may be located between the window and the frame, and curved along with the window by an external force, which is applied in response to the window being curved.

The display may be attached onto a rear surface of the window so as to be curved along with the window.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of preferred configurations of mobile terminals according to the present invention, with reference to the accompanying drawings. Hereinafter, suffixes "module" and "unit or portion" for components used herein in description are merely provided only for facilitation of preparing this specification, and thus they are not granted a specific meaning or function. Hence, it should be noticed that "module" and "unit or portion" can be used together.

Mobile terminals may be implemented using a variety of different types of terminals. Examples of such terminals include mobile terminals, such as mobile phones, smart phones, notebook computers, digital broadcast terminals, Personal Digital Assistants (PDA), Portable Multimedia Players (PMP), navigators and the like, and stationary terminals, such as digital TVs, desktop computers and the like. The following description assumes that the terminal is a mobile terminal. However, it can be easily understood by those skilled in the art that the configuration according to the following description can be applied to the stationary terminals except for components particularly provided for mobility.

Figure 1:
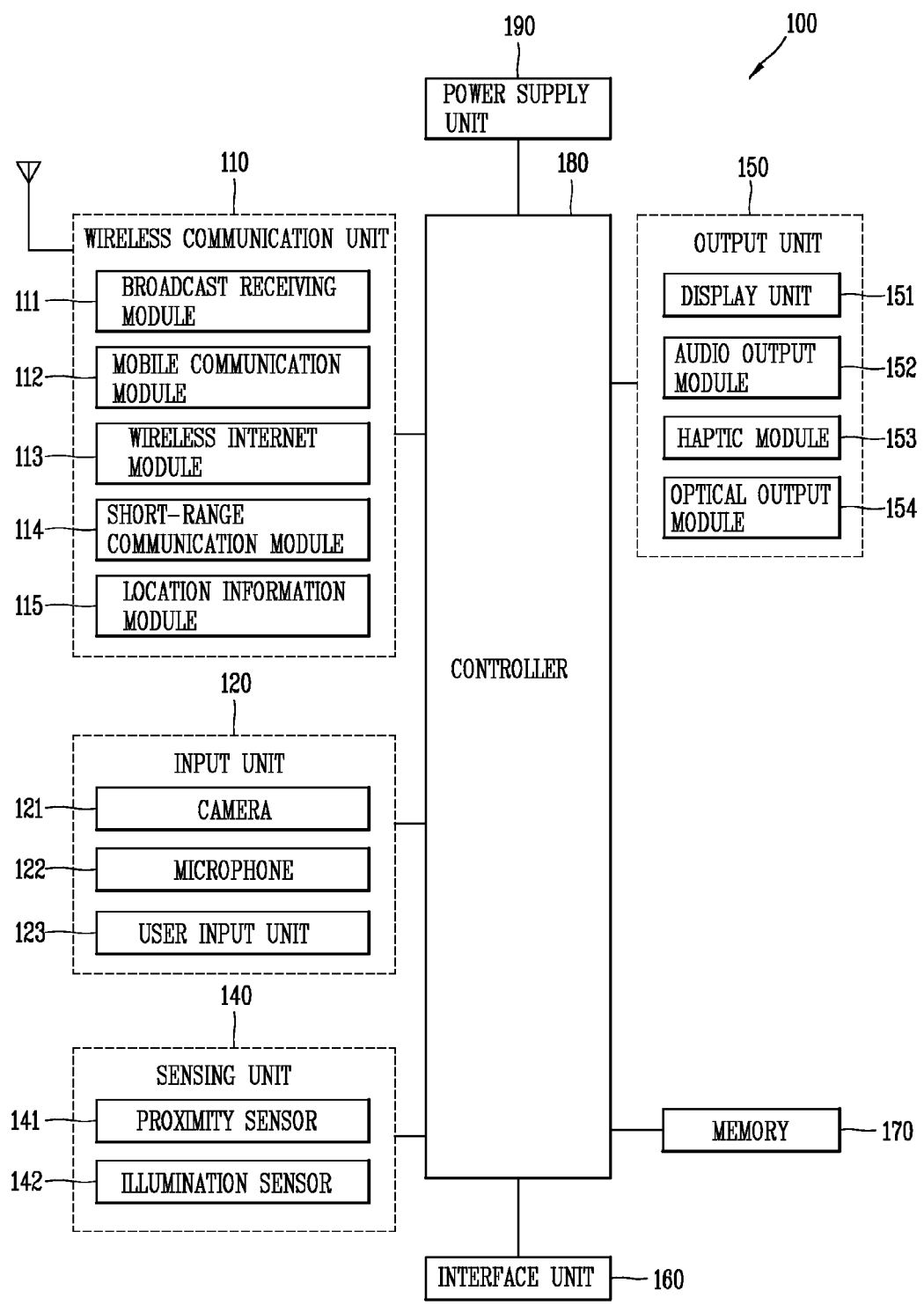
FIG. 1 is a block diagram of a mobile terminal in accordance with one exemplary embodiment of the present disclosure.

FIG. 1 is a block diagram of a mobile terminal in accordance with one embodiment of the present invention.

Description will now be given in detail according to the exemplary embodiments disclosed herein, with reference to the accompanying drawings. For the sake of brief description with reference to the drawings, the same or equivalent components will be provided with the same reference numbers, and description thereof will not be repeated. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. It should be understood that all changes and modifications that fall within the metes and bounds of the claims, or equivalents of such metes and bounds are therefore intended to be embraced by the appended claims.

The terms including an ordinal number such as first, second, etc. can be used to describe various elements, but the elements should not be limited by those terms. The terms are used merely for the purpose to distinguish an element from the other element.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation as far as it represents a definitely different meaning from the context.

Terms 'include' or 'has' used herein should be understood that they are intended to indicate an existence of several components or several steps, disclosed in the specification, and it may also be understood that part of the components or steps may not be included or additional components or steps may further be included.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

FIG. 1 is a block diagram of a mobile terminal 100 in accordance with one embodiment of the present invention.

The mobile terminal 100 may comprise components, such as a wireless communication unit 110, an Audio/Video (A/V) input unit 120, a user input unit 130, a sensing unit 140, an output unit 150, a memory 160, an interface unit 170, a controller 180, a power supply 190 and the like. FIG. 1 shows the mobile terminal 100 having various components, but it is understood that implementing all of the illustrated components is not a requirement. Greater or fewer components may alternatively be implemented.

Hereinafter, each component 110 to 190 is described in sequence.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having at least one of a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output by the various components depicted in FIG. 1A, or activating application programs stored in the memory 170.

As one example, the controller 180 controls some or all of the components illustrated in FIG. 1 to execute an application program that have been stored in the memory 170. In addition, the controller 180 may combine at least two of components included in the mobile terminal 100 for operation, in order to activation of the application program.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least some of those components may be cooperative to implement operations, controls or control methods of a mobile terminal in accordance with various exemplary embodiments disclosed herein. Also, the operations, controls or control methods of the mobile terminal may be implemented on the mobile terminal by the execution of at least one application program stored in the memory.

Hereinafter, various components depicted in this figure will now be described in more detail, prior to describing various embodiments implemented by the mobile terminal 100.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), Wideband CDMA (WCDMA), High Speed Downlink Packet access (HSDPA), Long Term Evolution (LTE), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), Long Term Evolution (LTE), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, GSM, CDMA, WCDMA, LTE and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. If necessary, the location information module 115 may perform a function of another module of the wireless communication unit 110, in order to obtain data associated with a location of the mobile terminal in a replacing manner or an additional manner.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen. The proximity sensor 141 may have a more extended lifespan and higher utilization than the contact sensor.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch (or touch input) applied to the touch screen, such as the display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provide internal power and supply the appropriate power required for operating respective elements and components included in the mobile terminal 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Figure 2:
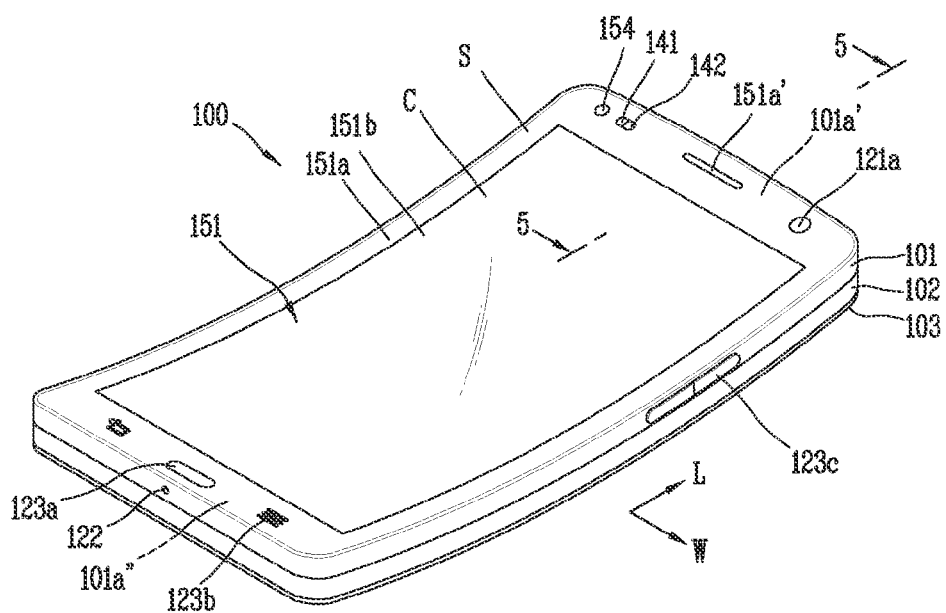
FIGS. 2 and 3 are conceptual views of one example of a mobile terminal, viewed from different directions, in accordance with the present disclosure.
Figure 3:
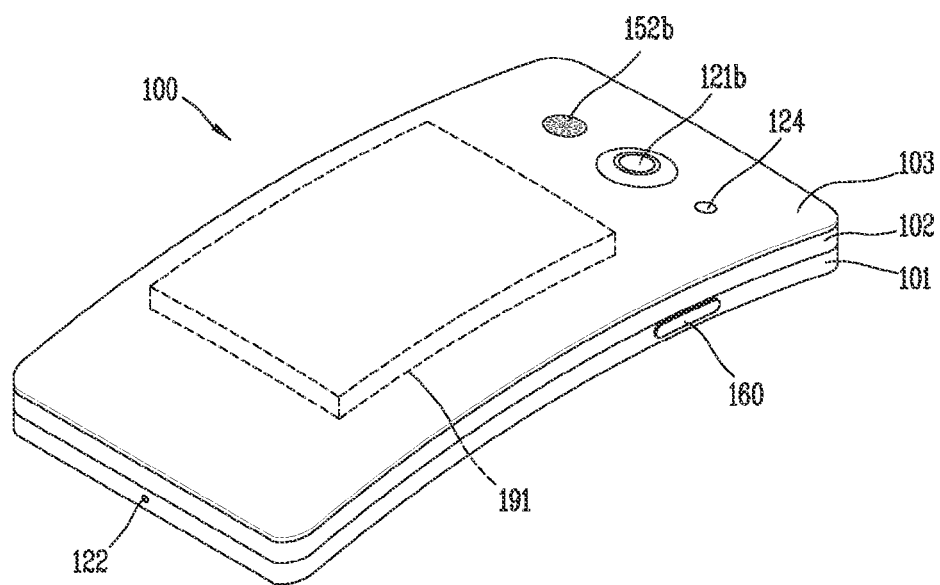

FIGS. 2 and 3 are conceptual views of one example of a mobile terminal 100, viewed from different directions, in accordance with the present disclosure.

Referring to FIGS. 2 and 3, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, regarding the mobile terminal 100 as at least one assembly (or set), the terminal body may be understood as a conception referring to the assembly (or the set).

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown as located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 is shown having a display unit 151, first and second audio output modules 152a and 152b, a proximity sensor 141, an illumination sensor 142, an optical output module 154, first and second cameras 121a and 121b, a first manipulation unit 123a, 123b, a second manipulation unit 123c, a microphone 122, an interface unit 160, and the like.

Hereinafter, description will be given, as illustrated in FIGS. 2 and 3, of an exemplary embodiment of a mobile terminal, in which the display unit 151, the first audio output module 152a, the proximity sensor 141, the illumination sensor 142, the optical output module 154, the first camera 121a and the first manipulation units 123a and 123b are disposed on a front surface of a terminal body, the second manipulation unit 123c, the microphone 122 and the interface unit 160 are disposed on a side surface of the terminal body, and the second audio output module 152b and the second camera 121b are disposed on a rear surface of the terminal body.

However, it is to be understood that alternative arrangements are possible and within the teachings of the instant disclosure. Some components may be omitted or rearranged. For example, the first manipulation unit 123a, 123b may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a, 123b.

The first audio output module 152a may be implemented in the form of a receiver to transfer voice audio to a user's ear, and the second audio output module 152b may be implemented in the form of a loud speaker to output alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first manipulation unit 123a, 123b and the second manipulation unit 123c are examples of the user input unit 123, which may be manipulated by a user to provide input to the mobile terminal 100. The first and second manipulation units 123a, 123b and 123c may also be commonly referred to as a manipulating portion, and may employ any tactile method that allows the user to perform manipulation such as touch, push, scroll, or the like. The first and second manipulation units 123a, 123b and 123c may also employ any non-tactile method that allows the user to perform manipulation such as proximity touch, hovering, or the like.

FIGS. 2 and 3 illustrate the first manipulation unit 123a, 123b as a combination of a mechanical key 123a and a touch key 123b.

Input received at the first manipulation unit 123a, 123b and the second manipulation unit 123c may be used in various ways. For example, the first manipulation unit 123a, 123b may be used by the user to provide an input to a menu, home key, cancel, search, or the like, and the second manipulation unit 123c may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a, 123b in the rear input unit. As such, in situations where the first manipulation unit 123a, 123b is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Meanwhile, the display unit 151 according to the present disclosure may be formed in a curved shape along one direction of the terminal body, and this type is referred to as a curved display unit 151, hereinafter.

This exemplary embodiment illustrates that the curved display unit 151 is curved along a lengthwise direction L of the terminal body. That is, the curved display unit 151 may have a shape that both end portions thereof adjacent to the first audio output module 152a and the microphone 122, respectively, are curved with respect to a central portion of the curved display unit 151. Unlike this, the display unit 151 may also be formed in a shape curved along a widthwise direction W of the terminal body.

In addition to the curved display unit 151 in the curved shape, the mobile terminal 100 may also be formed in the curved shape on the whole.

Hereinafter, a device structure focusing on the curved display unit 151 will be described in more detail with reference to the accompanying drawings.

Figure 4:
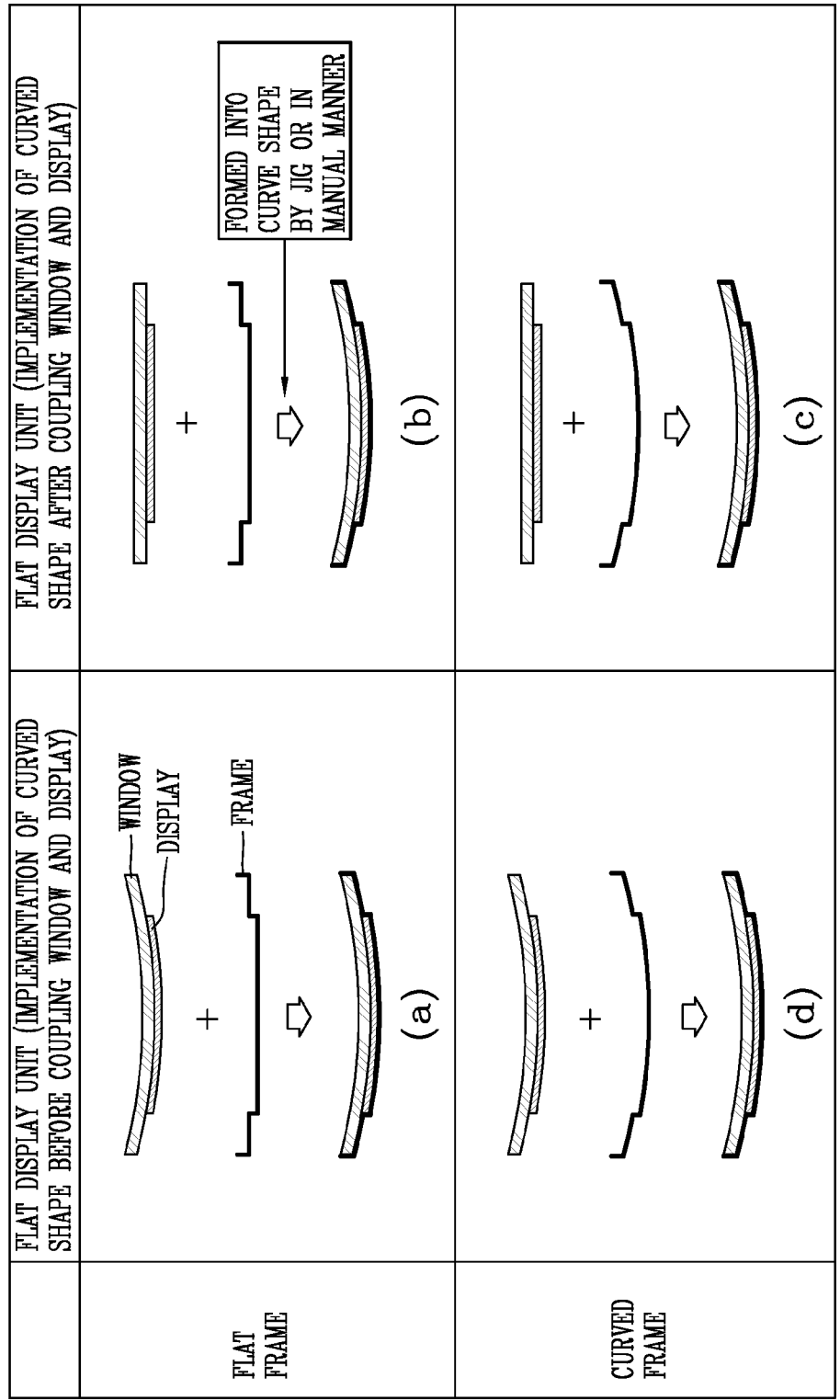
FIG. 4 is a conceptual view illustrating that a curved display unit is implemented.

FIG. 4 is a conceptual view illustrating that a curved display unit is implemented.

As illustrated in FIG. 4, a display unit may include a window and a display.

The window covers the display, and forms one surface of a terminal body. The window may be formed of a light-transmittable material, for example, light-transmittable synthetic resin, tempered glass and the like.

The window may include a portion through which light cannot be transmitted. For example, as illustrated in FIG. 2, the window may be divided into a central region C (see FIGS. 2 and 5) and an edge region S (see FIGS. 2 and 5) surrounding the central region C. The central region C may preferably be formed transparent and colorless such that visual information output to the display can be recognized from the outside, and the edge region S may preferably be formed colored and/or opaque such that an internal device structure of the mobile terminal cannot be exposed to the outside.

The window may be fabricated in a curved shape or first fabricated in a flat shape and then changed into a curved shape by a device (e.g., JIG) or in a manual manner. That is, the window may be curved when an external force is applied. For example, the window may be curved along one direction of the terminal body. Here, the window may have a preset radius of curvature.

Herein, the term "curved shape" may be used to describe that a device's cross-section taken in the lengthwise or widthwise direction has a curved profile. In accordance with one embodiment, a display unit in a flat form (e.g., a flat form of a window and a liquid crystal display adhered to the window) is attached to a frame in a curved form by a pressing procedure (e.g., manually or using a jig) so that the window is curved in conformity to the curved shape of the frame, thereby exerting a bending force to the display adhered to the window and also conforming the display to the curved shape of the frame and the window. That is, by conforming a window in a flat form to a curved frame, a display in a flat form attached to the window may also be conformed to the curved shape of the frame. In other words, a curved display structure, including a curved frame and a display unit conformed to the curved frame, can be manufactured in a simplified process by pressing and attaching a window in an originally flat form to a rigid frame in a curved shape.

The display may be disposed on the rear surface of the window, and output visual information through the window. The display unit may have an area corresponding to the light-transmittable region of the window, such that the user can recognize the visual information output on the display from the outside.

The display may include a liquid crystal panel (LCD) on which an image is output and a backlight unit for emitting light toward the LCD.

The LCD may include color filter (CF) glass and thin film transistor (TFT) glass, which are spaced apart from each other, liquid crystals filled between the CF glass and the TFT glass, a polarizer disposed on an upper surface of the CF glass, and another polarizer disposed on a rear surface of the TFT glass.

The backlight unit may include a light source, a light guide plate for guiding light emitted from the light source, a reflection film disposed on a rear surface of the light guide plate, and a diffusion film and a prism sheet laminated on the light guide plate.

The display may be interlayered or integrally formed with a touch sensor, to implement a touch screen. The touch screen may provide an input interface as well as an output interface between the mobile terminal and a user.

Between the window and the display may be provided an adhesive layer for adhering them onto each other. The adhesive layer may be made of optical clear adhesive (OCA), optical clear resin (OCR), and the like.

When an external force is applied, the display may be curved. The external force may be a coupling force which is applied when the display is coupled with another member or an external force which is applied by post-processing (for example, processing using the device (e.g., JIG) or by the manual operation).

When the display configures the display unit by being coupled to the rear surface of the window, the display unit may have a curved shape by the following methods.

For example, when a display fabricated in a flat shape is coupled to a window which is fabricated in a curved shape or changed into a curved shape through post-processing, the display may be changed into the curved shape in correspondence to the curved shape of the window through the coupling with the window. As another example, a window and a display, which are all formed in a flat shape, may be coupled to each other, and thereafter changed into a curved shape by the device (e.g., JIG) or the manual operation, thereby implementing a curved display unit. As still another example, a curved display unit may be implemented by coupling a window and a display each of which is fabricated in a curved shape by the device (e.g., JIG) or the manual operation.

The display unit may be coupled to a frame. In detail, the frame may be coupled to the window so as to support the window and accommodate the display. The frame may be fabricated in a curved shape from the beginning or first fabricated in a flat shape and thereafter changed into a curved shape by a device (e.g., JIG) or a manual operation. The frame may be curved when an external force is applied thereto.

Combining those configurations, a curved display can be implemented in various manners. Here, during a process of coupling each component, a component having a flat shape may be curved to correspond to a component having a curved shape through the coupling to each other.

For example, referring to (a) of FIG. 4, a display unit in a curved shape may be coupled to a frame in a flat shape. By the coupling with the display unit in the curved shape, the frame may be changed into a curved shape to correspond to the shape of the display unit.

Referring to (b) of FIG. 4, a display unit in a flat shape may be coupled to a frame in a flat shape. An assembly that the display unit and the frame are coupled to each other may be changed into a curved shape by a device (e.g., JIG) or a manual operation.

Referring to (c) of FIG. 4, a display unit in a flat shape may be coupled to a frame in a curved shape. By the coupling with the frame in the curved shape, the display unit may be changed into a curved shape to correspond to the shape of the frame.

Referring to (d) of FIG. 4, a display unit in a curved shape may be coupled to a frame in a curved shape. The display unit and the frame may be fabricated in the curved shape from the beginning or fabricated in a flat shape and thereafter changed into the curved shape by the device (e.g., JIG) or the manual operation.

The aforementioned structure may facilitate for implementing the curved display unit. Specifically, the structures may be applied to implement the conventional flat LCD into the curved display unit 151.

An OLED may have an advantage in that it can be fabricated by adjusting a curvature in various manners. On the other hand, an LCD may be easily used in case of less bending. Here, the LCD may preferably be curved within a range in which a curved degree has the least influence in image quality.

In such a manner, comparing with the case of implementing the curved display unit using the OLED, the case of implementing the curved display unit using the LCD has an advantage in view of fabricating the curved display unit with lower costs.

Of course, the curved display unit disclosed here may be implemented using the OLED, instead of the LCD.

Hereinafter, the structure of implementing the curved display unit 151 will be described in more detail. The following embodiment, as illustrated in (c) of FIG. 4, exemplarily illustrates that a display unit in a flat shape is coupled to a frame in a curved shape to be changed into a curved shape. However, the present disclosure may not be limited to this. That is, a technology of implementing a curved display unit to be explained later may also be applied to the other structures of implementing the curved display unit, which have been previously illustrated.

Also, a frame to which the display unit 151 is mounted may not be limited to the front case 101 which is to be explained hereinafter. The frame may also be a structure separate from the front case 101.

Figure 5:
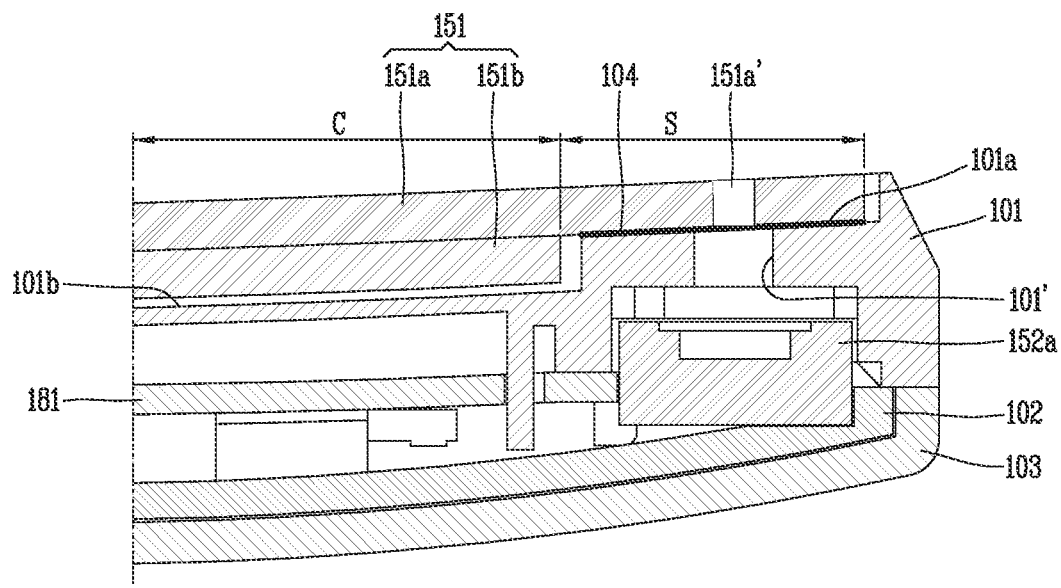
FIG. 5 is a cross-sectional view taken along the line 5-5 of FIG. 2.

FIG. 5 is a cross-sectional view taken along the line 5-5 of FIG. 2.

As illustrated in FIG. 5, the display unit 151 may be provided on a front surface of the terminal body to output visual information. Referring to FIG. 5, the window 151*a* may be mounted on the front case 101 so as to form the front surface of the mobile terminal 100 together with the front case 101.

The front case 101 may be provided with a window mounting portion 101*a* on which the window 151*a* is mounted and to which at least part of the window 151*a* is coupled. The window mounting portion 101*a* may be configured to support the edge region S of the window 151*a*, and be formed in a loop shape to surround the display 151*b*.

FIG. 5 illustrates that the window mounting portion 101*a* is provided on an upper end portion of the mobile terminal 100. Referring to FIG. 5, a guide hole 101' which guide sounds output from the first audio output module 152*a* may be provided at the window mounting portion 101*a*, such that the sounds can be externally emitted through an audio hole 151*a'* of the window 151*a*.

A mounting surface of the window mounting portion 101*a*, to which the window 151*a* is coupled, may be formed in a curved shape (i.e., having a curve side profile) so as to generate a bending force (or a curving force), by which the window 151a is curved. That is, when the window 151a is mounted onto the mounting surface, the bending force may be applied to the window 151a such that the window 151a can be curved to correspond to the mounting surface. As a result, the window 151a in a curved shape transfers the bending force to the display 151b adhered to the window 151a, and the display 151b is also curved by the transferred bending force to conform to the curved window 151a.

Referring back to FIG. 2, the window mounting portion 101a may include a first mounting surface 101a' and a second mounting surface 101a" which correspond to both end portions of the window 151a in a lengthwise direction L of the window 151a. The first mounting surface 101a' and the second mounting surface 101a" may be disposed at both sides with interposing the display 151b therebetween, and be surrounded by the edge region S of the window 151a.

The window mounting portion 101a may further include side mounting surfaces at both sides of the window 151a in a widthwise direction (W) of the window 151a. The side mounting surfaces may be configured to connect the first mounting surface 101a' and the second mounting surface 101a" at left and right sides, respectively. With the configuration, the window mounting portion 101a may be formed in a loop shape, so as to support edges of a rear surface of the window 151a.

The first mounting surface 101a' and the second mounting surface 101a" may have the same curvature. Accordingly, when the window 151a is coupled to the window mounting portion 101a, the window 151a may be transformed into a curved shape to correspond to the curvature of the first and second mounting surfaces 101a' and 101a", so as to have a predetermined curvature. Consequently, the curvature of the window 151a may be adjustable by adjusting the curvature of the first and second mounting surfaces 101a' and 101a".

Also, the side mounting surfaces may have a curved shape with the same curvature as those of the first and second mounting surfaces 101a' and 101a". In other words, the side mounting surfaces may also have a curved side profile, which constitutes the curved shape of the window mounting portion 101a.

The window 151a may be separated from the window mounting portion 101a by a restoring force because it is fabricated in a shape of a flat plate. In order for the window 151a to be maintained in the curved shape while being coupled to the first and second mounting surfaces 101a' and 101a", bonding layers 104 may be provided between the window 151a and the first mounting surface 101a' and between the window 151a and the second mounting surface 101a". The bonding layer 104 may be an adhesive, such as optical clear adhesive (OCA) or optical clear resin (OCR), or a bonding tape. The bonding layer 104 may be affected by a tensile force, which is applied in a direction that the window 151a is separated from the window mounting portion 101a.

In addition, bonding layers 104 may further be provided on the side mounting surfaces, respectively, to increase a coupling force (or bonding force) of the window 151a with respect to the window mounting portion 101a. Here, the bonding layer 104 may has a loop shape. As one example, when the bonding layer 104 is an adhesive tape, the adhesive tape may have a loop shape corresponding to the edges of the rear surface of the window 151a.

The bonding layer 104 may be more firmly coupled to a synthetic resin material than to a metallic material. Therefore, the first and second mounting surfaces 101a' and 101a" may be formed of synthetic resin, taking into account the characteristic of the bonding layer 104. Also, when the first and second mounting surfaces 101a' and 101a" are formed of the synthetic resin, a degradation of a radio performance of an antenna (not illustrated) which is disposed on a rear surface of the first and second mounting surfaces 101a' and 101a" may be minimized.

The side mounting surfaces may also be made of synthetic resin so as to be easily bonded to the bonding layers 104.

Meanwhile, the display 151b may be attached onto a rear surface of the window 151a to be curved, in response to the window 151a being curved. Here, the curvature of a front surface of the display 151b may be the same as that of a rear surface of the window 151a. This may result in minimization of distortion of visual information which is output to the display 151b.

The front case 101 may further include a display mounting portion 101b in which the display 151b is accommodated. The display mounting portion 101b may extend from the window mounting portion 101a to cover the rear surface of the display 151b.

As illustrated in FIG. 5, the display mounting portion 101b may be formed in the curved shape to correspond to the display, 151b which is curved in response to the window 151a being curved. The curvature of radius of the display mounting portion 151b may depend on the curvature of the display 151b. The curvature of the display mounting portion 101b may be the same or greater than that of the display 151b, such that an edge region of the display 151b can be prevented from being damaged due to the contact with the display mounting portion 101b.

Unlike this, the display mounting portion 101b may be formed in a flat shape. Since the display 151b is formed in the curved shape, a central portion of the display 151b may be disposed adjacent to the display mounting portion 101b more than both end portions thereof. To prevent the central portion of the display 151b from being damaged due to coming in contact with the display mounting portion 151b upon an external impact applied thereto, an impact absorbing pad may be provided between the central portion of the display 151b and the display mounting portion 101b.

Although not illustrated, a rear surface of the display mounting portion 101b may form a bottom surface on which the battery 191 is mounted. Here, the rear surface of the display mounting portion 101b may be formed in a flat or curved shape to correspond to the shape of the battery 191.

Meanwhile, unlike the example in which the front case 101 and the rear case 102 define an inner space for accommodating various electronic components, the mobile terminal 100 may also be configured such that one case defines the inner space. Here, the mobile terminal 100 may be implemented to have a uni-body that synthetic resin or metal extends from side surfaces to a rear surface.

According to the present disclosure having the configuration, a mounting surface of a mounting portion to which the window 151a is coupled may be formed in a curved shape, such that the window 151a can be transformed into a curved shape to correspond to the mounting surface when the window 151a is mounted on the mounting surface. Therefore, the conventional flat display unit 151 may be easily implemented into a curved display unit in a manner of being coupled to the front case 101, and the curved display unit 151 having various curvatures can be easily realized by adjusting the curvature of the mounting surface.

Figure 6:
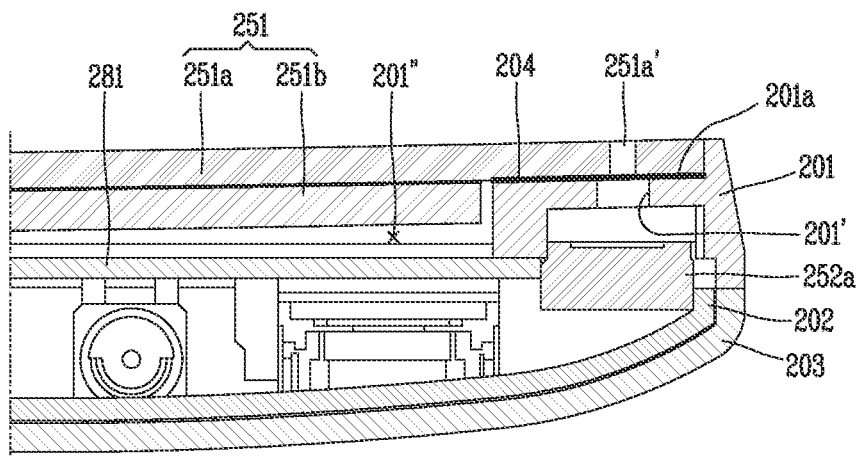
FIG. 6 is a cross-sectional view illustrating another exemplary embodiment of a mobile terminal disclosed herein.

FIG. 6 is a cross-sectional view illustrating another exemplary embodiment of a mobile terminal disclosed herein.

As illustrated in FIG. 6, a front case 201 may include a hollow portion 201" which is surrounded by a window mounting portion 201a. The hollow portion 201" may be formed to correspond to a display 251b, such that the display 251b can be accommodated therein.

A printed circuit board (PCB) 281 may be coupled to the front case 201 so as to cover a rear surface of the display 251b accommodated in the hollow portion 201". Any electronic element may not preferably be disposed on one surface of the PCB 281 which faces the display 251b. Those electronic elements may rather be mounted on the other surface of the PCB 281.

The PCB 281 may be coupled to the front case 201 to reinforce rigidity of the front case 201, such that a bending force by which the front case 201 makes the window 251a curved can be maintained. The PCB 281 may be coupled to the front case 201 at both end portions of the front case 201 which face each other, to reinforce of the rigidity of the front case 201. Also, the PCB 281 may be disposed to cover the full hollow portion 201".

The PCB 281 may be coupled to the front case 201 by use of an adhesive, a bonding tape, a hook, a boss, and the like. An adhesive or a bonding tape may be disposed between the display 251b and the PCB 281 to bond them to each other, or an elastic pad or a metallic sheet may be disposed therebetween to prevent damage caused due to a direct contact therebetween.

Meanwhile, the PCB 281 may be formed in a curved shape to correspond to the display 251b.

Figure 7:
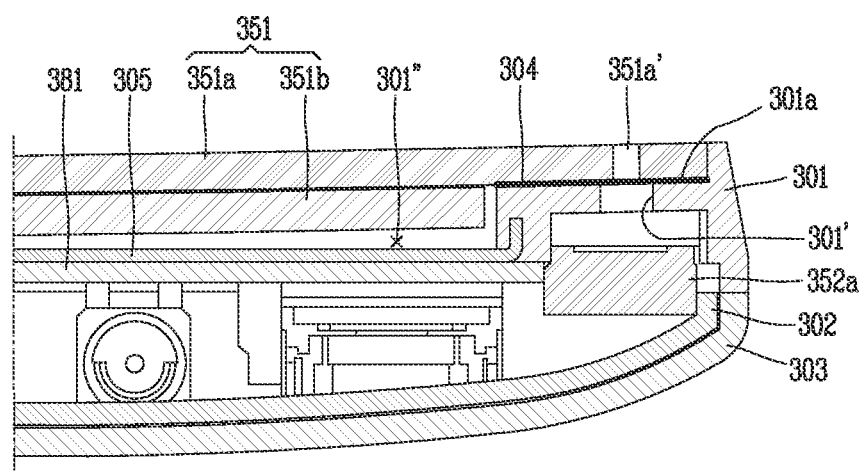
FIG. 7 is a cross-sectional view illustrating another exemplary embodiment of a mobile terminal disclosed herein.

FIG. 7 is a cross-sectional view illustrating another exemplary embodiment of a mobile terminal 300 disclosed herein.

As illustrated in FIG. 7, a front case 301 may include a hollow portion 301" which is surrounded by a window mounting portion 301a so as to form a space for accommodating a display 351b therein. A reinforcing member 305 which covers a rear surface of the display 351b may be coupled to the front case 301 such that the front case 301 can have reinforced rigidity.

The reinforcing member 305 may be formed of a metal (for example, magnesium, stainless steel, aluminum, etc.) to provide sufficient rigidity to the front case 301. The reinforcing member 305 may be coupled with the front case 301 which is formed of synthetic resin, through insert injection, so as to be integrally formed with the front case 301. It is especially beneficial to provide the reinforcing member 305 made of a metal in a curved shape to be coupled with the front case 201 when a LCD is used as the display because a LCD is more rigid than a flexible OLED and has a greater tendency to return to its original flat form when curved by the front case 301. The reinforcing member 305 may be provided with a hole (not illustrated) through which a flexible PCB (FPCB; see 581a of FIG. 12) connecting the display 351b to a PCB 381 is inserted.

The reinforcing member 305 may be formed in a flat shape or formed in a curved shape to correspond to a curved shape of the display 351b.

Meanwhile, the reinforcing member 305 may be provided with beads (not illustrated) which are protruded by a pressing process to reinforce strength of the reinforcing member 305. For example, the beads may extend along a direction that the curved display unit 351 is curved. In some cases, the beads may be formed with at least one portion bent.

The PCB 381 on which electronic components are mounted may be disposed on a rear surface of the reinforcing member 305. The PCB 381 may be coupled to the front case 301 to reinforce the rigidity of the front case 301 along with the reinforcing member 305.

Hereinafter, a structure that the PCB 381 is fixed to the front case 301 will be described in more detail.

Figure 8A:
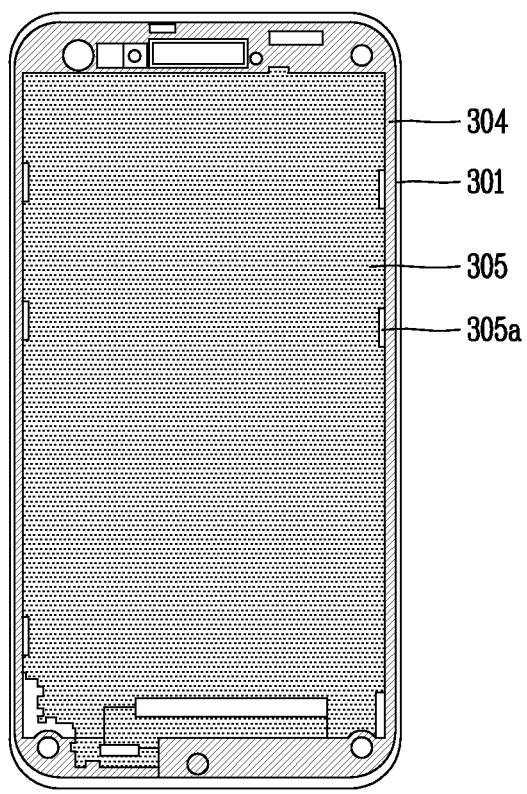
FIG. 8A is a planar view illustrating a front surface of a front case illustrated in FIG. 7.

FIG. 8A is a planar view illustrating a front surface of the front case 301 illustrated in FIG. 7.

As illustrated in FIG. 8A, the front case 301 may have a loop shape supporting edge regions of the rear surface of the window 351a (see FIG. 7). The front case 301 may be formed of a synthetic resin material, which facilitates an application of an adhesive, an adhesive tape and the like for the coupling with the window 351a. The synthetic resin material, for example, may include PC-based synthetic resin, fiber-reinforced plastic and the like. Also, by forming the front case 301 using the synthetic resin material, degradation of a radio performance of an antenna which is disposed on a rear surface of the front case 301 can be prevented. Further, the synthetic resin material may also be beneficial when the front case 301 needs to be formed to include various shapes, e.g., by molding, to accommodate various components. That is, the front case 301 may need to be formed to dispose thereon components such as a receiver, a sensor, and a camera and may need to include molded portions to mount these components thereon, and employing a synthetic resin material for the front case 301 in one embodiment may facilitate forming the various shapes and molded portions on the front case 301. In accordance with one embodiment, the front case 301 formed of a synthetic resin include a top mounting surface where molded portions are provided to dispose components such as a receiver, a speaker, a sensor, and a camera thereon and a bottom mounting surface where an antenna is disposed. However, it is readily appreciable that various components may be provided on either of the top and bottom mounting surfaces.

The reinforcing member 305 may be coupled to the front case 301 to obscure the hollow portion 301" (see FIG. 7). Such coupling may allow the reinforcing member 305 to form a space for accommodating the front case 301 and the display 351b (see FIG. 7).

The reinforcing member 305 may be formed of a metal (for example, magnesium, stainless steel, aluminum, etc.) and integrally formed with the front case 301 formed of the synthetic resin material through insert injection. Upon the insert injection, the reinforcing member 305 may be bent by a mold into a preset shape along with the front case 301. Also, as aforementioned, it may be possible to form only the front case 301 in a curved shape and the reinforcing member 305 in a flat shape.

Also, for firmly coupling the front case 301 and the reinforcing member 305, the reinforcing member 305 may be provided with a through hole 305a, in which the synthetic resin material forming the front case 301 is partially inserted upon the insert injection. The through hole 305a may be located without bothering an area where the display 351b is mounted. For example, the through hole 305a may be disposed to obscure the edge region S of the window 351a.

In addition, the front case 301 may extend along an outer circumference of the terminal body to form an appearance of the mobile terminal Here, an externally-exposed portion of the front case 301 may surround side surfaces of the window 351a, and surface-treated for providing an attractive appearance.

Hereinafter, a structure that the PCB 381 is fixed to the front case 301 will be described in more detail.

Figure 8B:
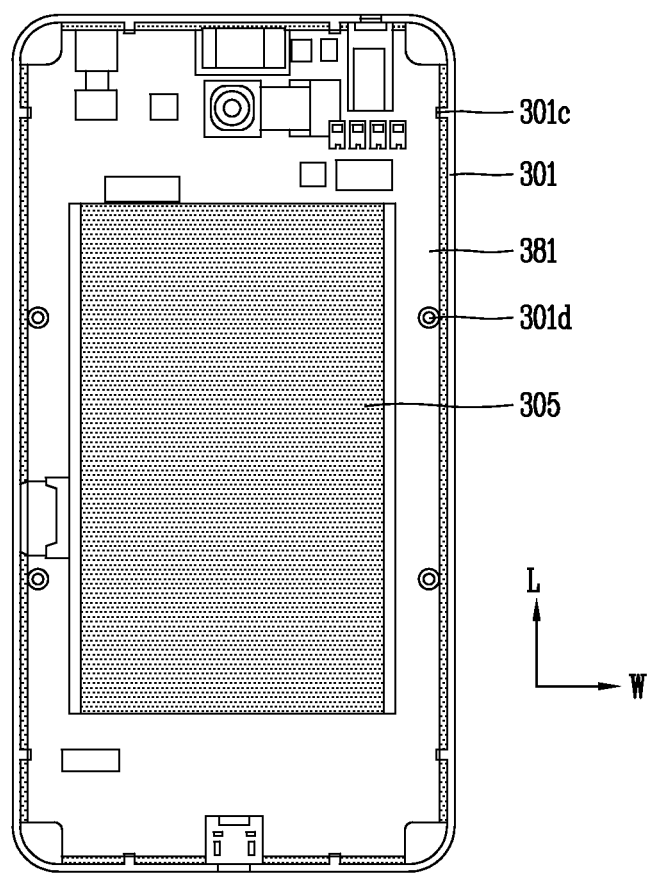
FIG. 8B is a conceptual view illustrating that a printed circuit board (PCB) is mounted on a rear surface of the front case illustrated in FIG. 7.

FIG. 8B is a conceptual view illustrating a status that the PCB 381 is mounted on the rear surface of the front case 301 illustrated in FIG. 7.

As illustrated in FIG. 8, the PCB 381 may be coupled to the front case 301 to reinforce the rigidity of the front case 301, such that a bending force by which the front case 301 makes the window 351a curved can be maintained. The PCB 381 may have a size corresponding to an inner circumference of the front case 301, and in some cases, have an open portion. For example, when the rear surface of the reinforcing member 305 forms a bottom surface on which the battery 191 (see FIG. 3) is disposed, the PCB 381 may have a shape in which a portion corresponding to the bottom surface is open such that the reinforcing member 305 can be exposed therethrough.

The front case 301 may be provided with elements which are disposed at plural positions thereof for fixing the PCB 381. For example, the front case 301 and the reinforcing member 305 may be provided with hooks 301c and bosses 301d for fixing the PCB 381. FIG. 8 exemplarily illustrates that the plurality of hooks 301c are disposed at both end portions of the front case 301 in a lengthwise direction L of the front case 301, and the plurality of bosses 301d are disposed at both side portions of the front case 301 in a widthwise direction W of the front case 301.

Hereinafter, a structure that the PCB 381 is fixed by the hooks 301c and the bosses 301d will be described in sequence.

Figure 9:
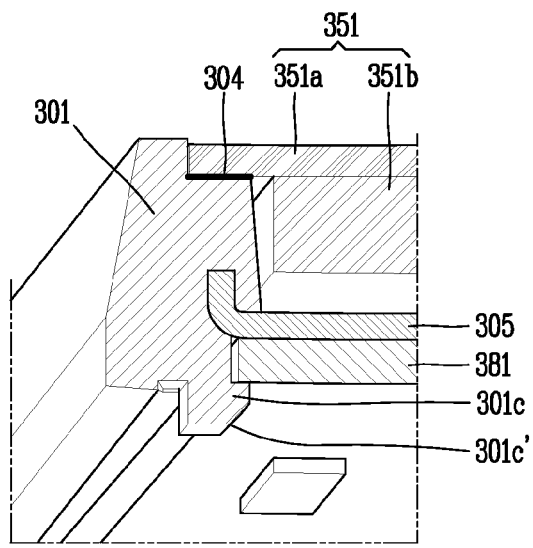
FIG. 9 is a conceptual view illustrating a fixing structure of the PCB using hooks illustrated in FIG. 8B.

FIG. 9 is a conceptual view illustrating a fixing structure of the PCB 381 using the hooks 301c illustrated in FIG. 8B.

As illustrated in FIG. 9, the front case 301 may be provided with the hook 301c which covers a rear surface of the PCB 381 to fix the PCB 381. The hook 301c may inwardly protrude from an edge of the front case 301 to cover an edge of a rear surface of the front case 301.

When the PCB 381 is coupled to cover the rear surface of the reinforcing member 305, the PCB 381 may press a tilt surface 301c' of the hook 301c such that the hook 301c can be outwardly deformed in an elastic manner, and then inserted into a space between the reinforcing member 305 and the hook 301c. Here, in order for the PCB 381 inserted in the space to be fixedly closely adhered onto the reinforcing member 305, an interval between the reinforcing member 305 and the hook 301c may be set to be smaller than or equal to a thickness of the PCB 381.

Meanwhile, a heat diffusion sheet (not illustrated) may be provided between the reinforcing member 305 and the PCB 381, to diffuse heat generated from the PCB 381 to the metallic reinforcing member 305. The heat diffusion sheet may be made of graphite or copper which has a radiation effect.

Figure 10:
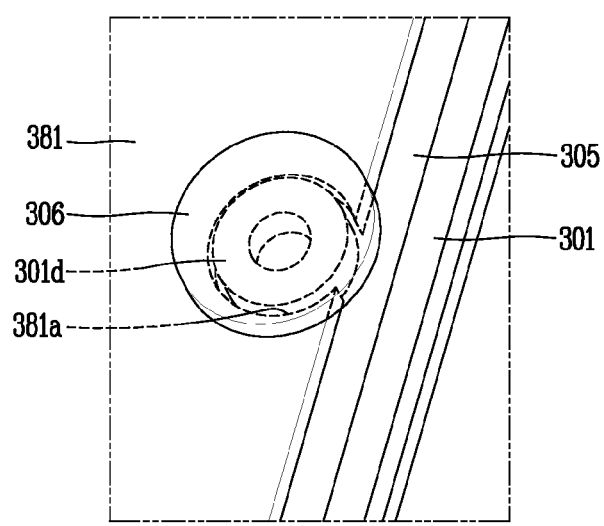
FIG. 10 is a conceptual view illustrating a coupling structure of the PCB using bosses illustrated in FIG. 8B.

FIG. 10 is a conceptual view illustrating a coupling structure of the PCB 381 using the bosses 301d illustrated in FIG. 8B.

As illustrated in FIG. 10, the boss 301d which is inserted through a through hole 381a of the PCB 381 may be formed on the rear surface of the reinforcing member 305 in a protruding manner. When the reinforcing member 305 is formed of a metal, the boss 301d may be coupled to the reinforcing member 305 in a welding manner. By the insertion of the boss 301d into the through hole 381a, the PCB 381 may be restricted from being moved in a radial direction of the boss 301d. That is, an installed position of the PCB 381 may be limited by the boss 301d.

A coupling member 306 may be coupled to the boss 301d to cover the PCB 381, such that the PCB 381 can be prevented from being separated in an axial direction of the boss 301d.

Meanwhile, when the PCB 381 is curved in response to being coupled to the front case 301, the through hole 381a of the PCB 381 may be formed in a shape of a long slit which extends along the curved direction so as to prevent interference with the boss 301d.

Figure 11:
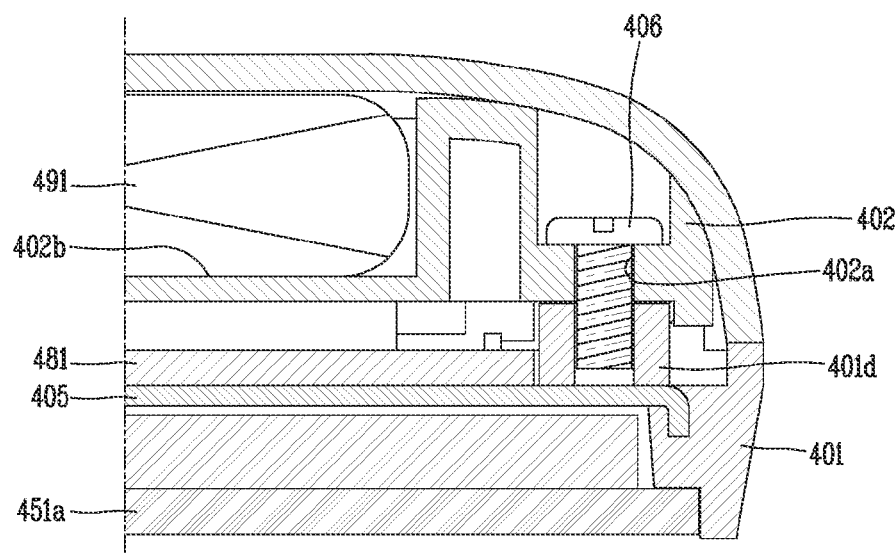
FIG. 11 is a cross-sectional view illustrating another exemplary embodiment of the structure using the bosses, which illustrates a coupling structure between a front case and a rear case.

FIG. 11 is a cross-sectional view illustrating another exemplary embodiment of the structure using bosses 401d, which illustrates a coupling structure between a front case 401 and a rear case 402.

As illustrated in FIG. 11, the rear case 402 may be disposed to cover a PCB 481, and be provided with a coupling hole 402a corresponding to a boss 401d. A coupling member 406 may be coupled to the boss 401d through the coupling hole 402a, such that the rear case 402 and a reinforcing member 405 can be coupled to each other. With the structure, the front case 401 and the rear case 402 may be coupled to each other by the intervention of the reinforcing member 405. This may result in reinforced rigidity of the front case 401. Accordingly, a bending force by which the front case 401 makes a window 451a curved can be maintained.

The rear case 402 may be provided with a battery accommodating portion 402b for accommodating a battery 491 therein. Or, the rear case 402 may be formed in a shape with an open portion, through which the reinforcing member 405 is exposed to form a bottom surface on which the battery 491 is mounted. The open portion may correspond to the bottom surface. Here, a portion of the PCB 481 corresponding to the bottom surface may also be open. The rear case 402 may cover an inner side surface of the PCB 481 to prevent the PCB 481 from being exposed when the rear case 402 is coupled.

Figure 12:
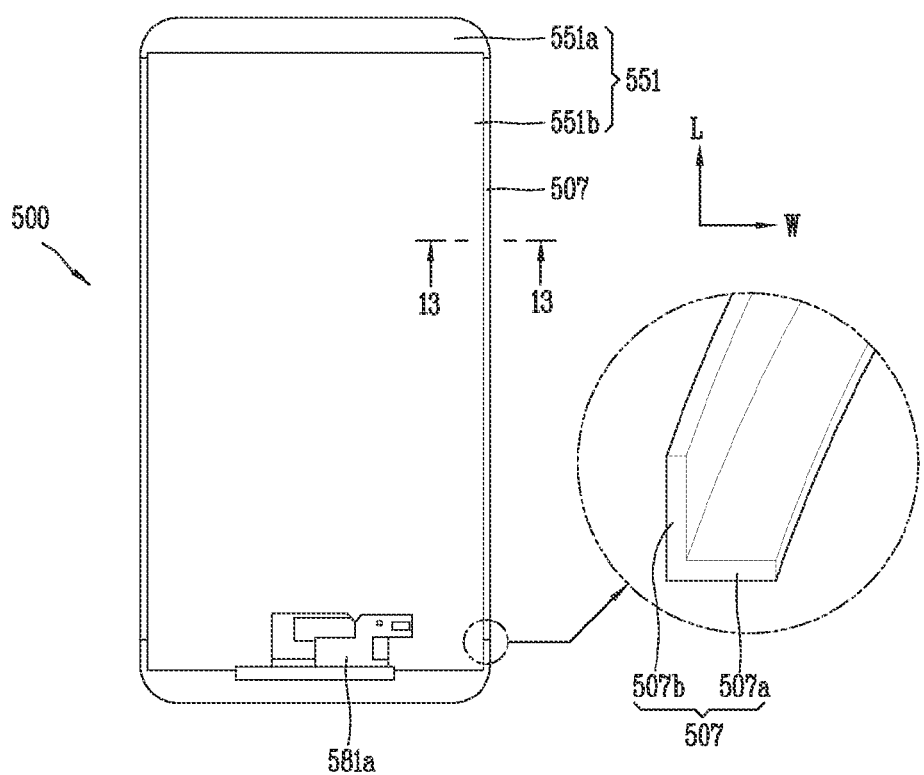
FIG. 12 is a planar view illustrating another exemplary embodiment of a mobile terminal disclosed herein, which illustrates a rear surface of a curved display unit.
Figure 13:
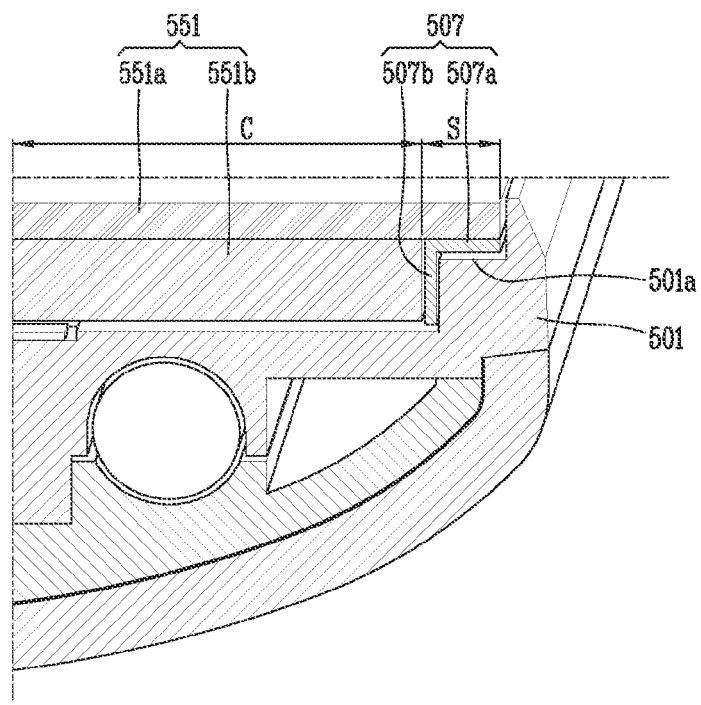
FIG. 13 is a cross-sectional view of the mobile terminal, taken along the line 13-13 of FIG. 12.

FIG. 12 is a planar view illustrating another exemplary embodiment of a mobile terminal 500 disclosed herein, which illustrates a rear surface of a curved display unit 551, and FIG. 13 is a cross-sectional view of the mobile terminal 500, taken along the line 13-13 of FIG. 12.

As illustrated in FIGS. 12 and 13, shape-preserving members 507 which maintain a curved shape of a curved display unit 551 may be provided on a rear surface of the curved display unit 551.

The shape-preserving members 507 may be provided on both sides of a window 551a in a widthwise direction W of the window 551a, and extend along a lengthwise direction L of the window 551a. The shape-preserving members 507 may be covered by an edge region S of the window 551a so as not to be externally exposed.

The shape-preserving member 507 may be formed in a shape which is curved along the lengthwise direction of the window 551 so as to generate a bending force by which the window 551 is curved. The shape-preserving member 507 may be mounted on a window mounting portion 501a and coupled to a front case 501. The shape-preserving member 507 may be formed in a curved shape to correspond to the window mounting portion 501a.

The shape-preserving member 507 may be made of various materials, such as a metal, engineering plastic, etc. having high rigidities.

The shape-preserving member 507 may be formed in a bent shape to have increased rigidity. For example, as illustrated in FIGS. 12 and 13, the shape-preserving member 507 may include a first portion 507a and a second portion 507b.

The first portion 507a may be mounted on a rear surface of the window 551a and accommodated in the window mounting portion 501a. FIGS. 12 and 13 exemplarily illustrate that the first portions 507a are mounted on side mounting surfaces corresponding to both sides of the window 551a in a widthwise direction W of the window 551a.

The first portion 507a may be attached or coupled to each of the side mounting surfaces. For example, the first portion 507a may be attached onto the side mounting surface by use of an adhesive or adhesive tape.

Here, as aforementioned, both end portions of the window 551a in the lengthwise direction thereof may be attached onto first and second mounting surfaces 101a' and 101a" (see FIG. 2). The side mounting surfaces may be stepped more inwardly than the first and second mounting surfaces 101a' and 101a", thereby forming a space in which the first portions 507a are inserted.

The second portion 507b may be bent from the first portion 507a to reinforce rigidity of the first portion 507a. When the first portion 507a is mounted on the side mounting surface, the second portion 507b may be disposed to face a side surface of a display 551b.

The second portion 507b may be configured to be attached or coupled to an inner side surface of the front case 501. For example, the second portion 507b may be coupled to the inner side surface of the front case 501 by use of an adhesive, an adhesive tape and the like. Or, the shape-preserving member 507 may be fixed to the front case 501 in a manner that a hook protruding from the inner side surface of the front case 501 is inserted into a hole formed through the second portion 507b (positions of the hook and the hole may be changed vise versa) or a screw is inserted through the front case 501 and the second portion 507b. It may also be possible to apply a combination of the bonding structure using the adhesive or adhesive tape and the fixing structure using the hook and the screw to the method of fixing the shape-preserving member 507 to the front case 501.

Meanwhile, as aforementioned, the front case may be configured as a single member (for example, formed of the synthetic resin material), or configured by a combination of members which are formed of different materials (synthetic resin, metal, etc.) Hereinafter, several variations of the front case will be described.

FIGS. 14 to 17 are conceptual views illustrating exemplary variations of the front case 101 illustrated in FIG. 2.

Figure 14:
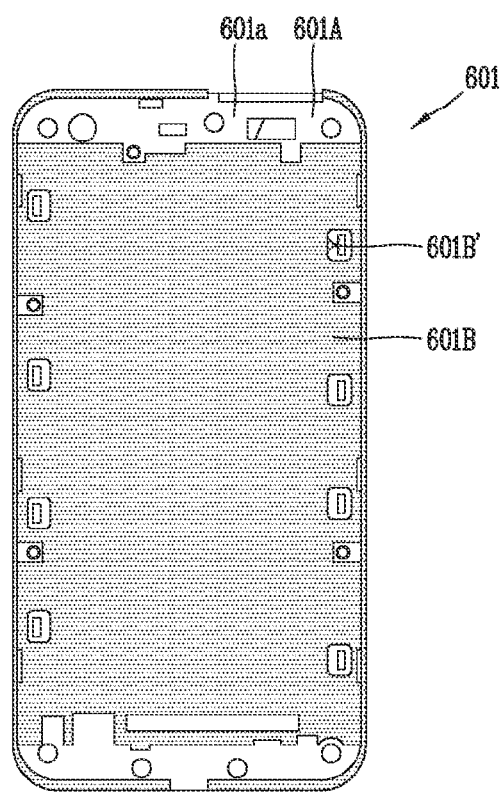
FIGS. 14 to 17 are conceptual views illustrating exemplary variations of the front case illustrated in FIG. 2.

As illustrated in FIG. 14, a front case 601 may include a first member 601A and a second member 601B. FIG. 14 exemplarily illustrates that the first member 601A forms a window mounting portion 601a and the second member 601B forms a display mounting portion (not illustrated).

When the window 151a (see FIG. 1) is mounted on the front case 601, the first member 601A may be disposed to face the edge region S of the window 151a. The first member 601A may be formed in a loop shape to surround the display 151B (see FIG. 1).

The first member 601A may be made of a synthetic resin material, which facilitates for applying an adhesive, a bonding tape, or the like to be bonded to the window 151a. The synthetic resin material may include PC-based synthetic resin, fiber-reinforced plastic and the like, for example. Also, by the formation of the first member 601A with the synthetic resin material, degradation of a radio performance of an antenna which is disposed on a rear surface of the first member 601A can be prevented.

The second member 601B may be coupled to cover a hollow portion of the first member 601A, to form the display mounting portion. The second member 601B may be formed of a metal (for example, magnesium, stainless steel, aluminum, etc.), and integrally formed with the first member 601A through insert injection.

During the insert injection, the second member 601B may be bent (curved) by a mold into a preset shape along with the first member 601A. Or, as aforementioned, only the first member 601A may be formed in a curved shape and the second member 601B may be formed in a flat shape.

Also, for firm coupling between the first member 601A and the second member 601B, the second member 601B may be provided with through holes 601B' in which parts of a material forming the first member 601A are inserted during the insert injection. The through holes 601B' may be arranged in a manner of avoiding a region where the display 151b is disposed. For example, the through holes 601B' may be arranged to be covered by the edge region S of the window 151a.

As aforementioned, the bosses 301d, 401d for fixing the PCB 381 (see FIG. 10), the rear case 402 (see FIG. 11) and the like may be provided on the rear surface of the second member 601B. The bosses 301d, 401d may be riveted or welded on the second member 601B.

In addition, the second member 601B may surround an outer circumference of the first member 601A to form an appearance of a mobile terminal 600. Here, a portion of the second member 601B which is externally exposed may surround the side surfaces of the window 151a, and be subjected to surface processing for preventing corrosion, defining attractive appearance and the like.

Figure 15:
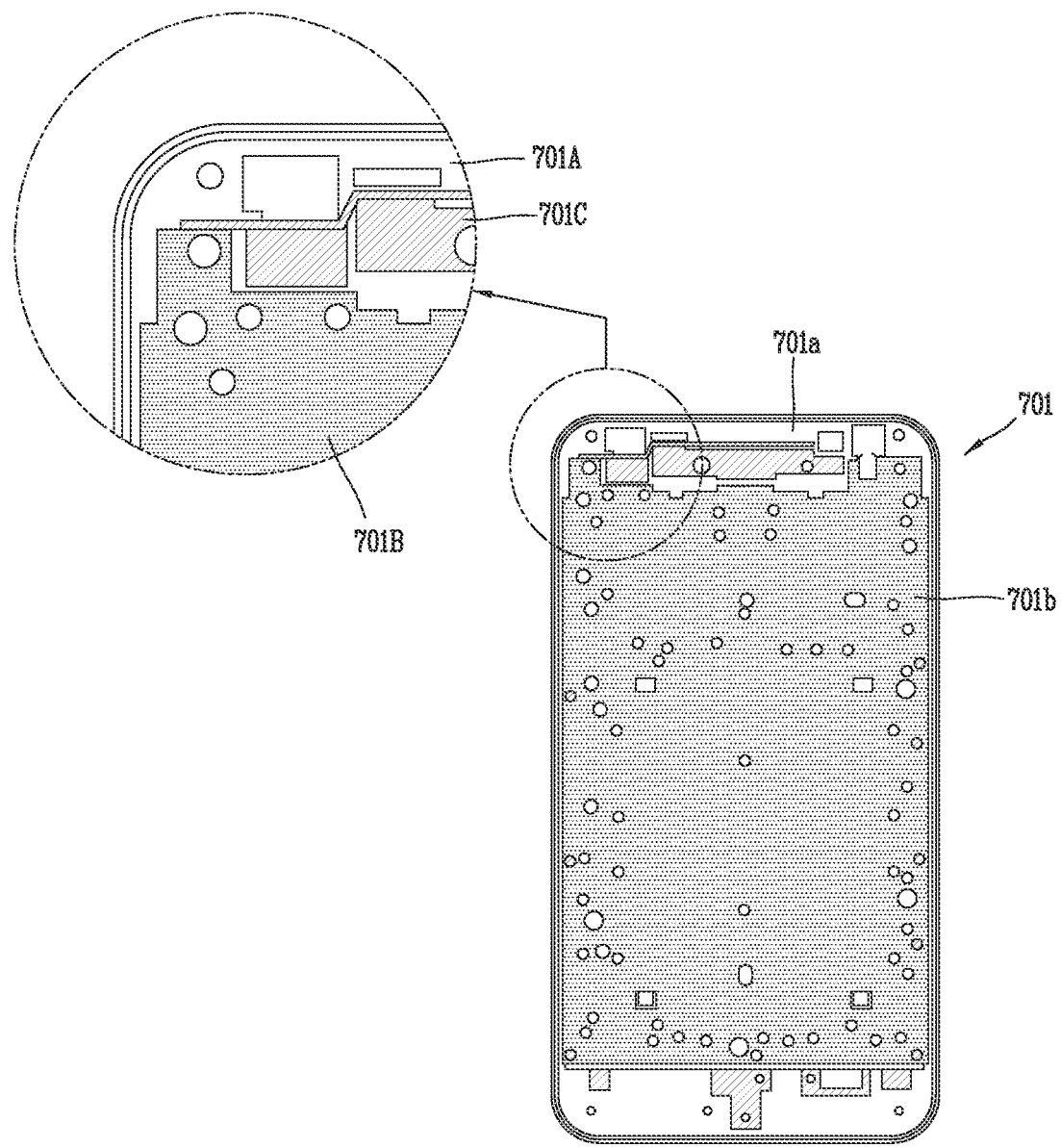

As illustrated in FIG. 15, a front case 701 may include a first member 701A made of synthetic resin, and second and third members 701B and 701C which are formed of different metals from each other. That is, unlike the foregoing embodiments, the front case 701 may be formed using different types of metals.

Referring to FIG. 15, the first member 701A may form a window mounting portion 701a to be coupled to the window 151a. The first member 701A may also have the feature of the first member 601A of the previous embodiment.

The second member 701B may be coupled to cover most of a hollow portion of the first member 701A, to form a display mounting portion 701b. The second member 701B may be formed of a material (for example, aluminum) having high thermal conductivity, so as to diffuse heat generated from the display 151b.

The third member 701C may be coupled to the first member 701A or the second member 701B, to increase rigidity of the front case 701. The third member 701C may be formed of a material (for example, stainless steel) having high strength. The third member 701C may extend along a lengthwise direction of the front case 701 corresponding to a curved direction thereof, or extend along a widthwise direction of the front case 701 and connect portions which extend along the lengthwise direction to prevent torsion.

Figure 16:
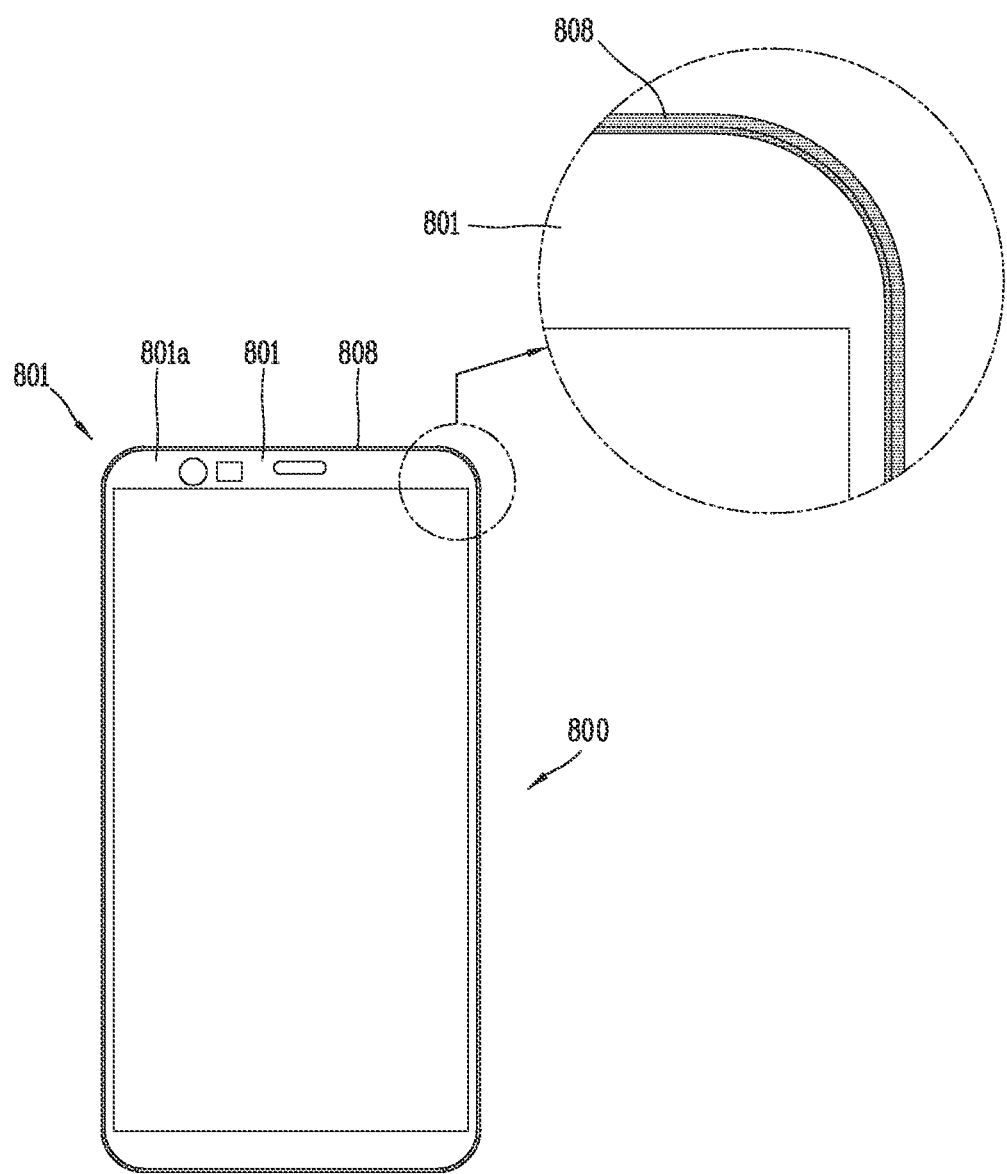
Figure 17:
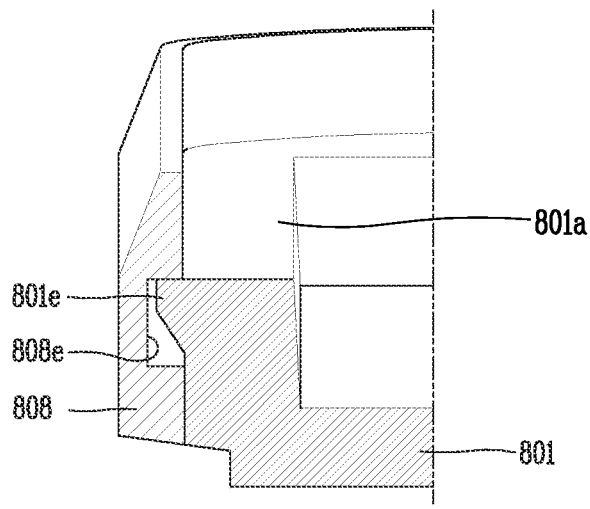

As illustrated in FIGS. 16 and 17, the front case 801 may be provided with a window mounting portion 801a formed of synthetic resin. The front case 801 may be coupled with an appearance-forming member 808 which surrounds an outer circumference of the front case 801 to form a side appearance of a mobile terminal 800.

The appearance-forming member 808 may be disposed to surround side surfaces of the window 151a which is mounted on the window mounting portion 801a. The appearance-forming member 808 may be formed in a curved shape to correspond to the front case 801 to reinforce rigidity of the front case 801. The appearance-forming member 808 may be formed of a material (for example, a metal, fiber-reinforced plastic, etc.) having high rigidity.

Meanwhile, a coupling structure for reinforcing the rigidity of the front case 801 may be provided between the front case 801 and the appearance-forming member 808.

For example, referring to FIG. 17, protrusions 801e may be formed on the front case 801. The protrusions 801e may be provided on both sides of the front case 801 in a widthwise direction of the front case 801, and then extend into a curved shape along a lengthwise direction of the front case 801. The protrusions 801e may be formed in a loop shape which extends along an outer circumference of the front case 801.

Stopping slots 808e for receiving the protrusions 801e therein may be formed on an inner side surface of the appearance-forming member 808. The stopping slots 808e may extend into a curved shape corresponding to the protrusions 801e. The stopping slots 808e may be formed in a loop shape extending along an inner circumference of the appearance-forming member 808.

With the structure, when the appearance-forming member 808 is coupled to the front case 801, the stopping slots 808e may receive the protrusions 801e such that the front case 801 can be maintained in the curved state. Therefore, even if the flat window 151a is coupled to the front case 801, the front case 801 may maintain a bending force by which the window 151a is curved.

The configurations and methods of the mobile terminal in the aforesaid embodiments may not be limitedly applied, but such embodiments may be configured by a selective combination of all or part of the embodiments so as to implement many variations.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
   a window disposed on a surface of a terminal body;
   a liquid crystal display (LCD) disposed on a rear surface of the window and configured to output visual information through the window;
   a frame formed in a curved shape and including a window mounting portion, on which the window is mounted and to which at least part of the window is coupled; and
   a reinforcing member disposed below a rear surface of the LCD and coupled to the frame to form a space with the frame for accommodating the LCD,
   wherein the frame is configured to apply a bending force to conform the window to the curved shape of the frame and to cause the conformed window to bend the LCD when the window is attached to the frame,
   wherein the reinforcing member is configured to reinforce rigidity of the frame such that the bending force is maintained, and
   wherein the reinforcing member is formed of a metal and integrally formed with the frame formed of a synthetic resin.

2. The mobile terminal of claim 1, wherein at least one mounting surface of the window mounting portion, to which the window is coupled, constitutes part of the curved shape.

3. The mobile terminal of claim 2, wherein the frame is further configured to apply the bending force to conform the window to the curved shape of the at least one mounting surface against a recovering force of the window to return to a flat form.

4. The mobile terminal of claim 1, wherein the window mounting portion comprises a first mounting surface and a second mounting surface respectively corresponding to both end portions of the window in a lengthwise direction of the window, the first and second mounting surfaces constituting part of the curved shape of the frame.

5. The mobile terminal of claim 4, wherein
   the first mounting surface includes molded portions for having at least one of a sensor, a camera, a speaker, and a receiver disposed thereon, and
   the second mounting surface includes a portion for having an antenna disposed thereon.

6. The mobile terminal of claim 4, wherein bonding layers are disposed between the window and the first mounting surface and between the window and the second mounting surface, respectively, such that the window maintains the curved shape while being coupled to the first and second mounting surfaces.

7. The mobile terminal of claim 6, wherein each of the bonding layers receives a tensile force, which is applied in a direction that the window is separated from the window mounting surface, when the window is coupled to the first and second mounting surfaces.

8. The mobile terminal of claim 1, wherein the LCD is attached on the rear surface of the window so that the LCD is curved according to a curved shape of the window.

9. The mobile terminal of claim 8, wherein the reinforcing member has a curved form.

10. The mobile terminal of claim 1, further comprising a printed circuit board coupled to the frame and disposed on a rear surface of the reinforcing member, and configured to reinforce rigidity of the frame along with the reinforcing member.

11. The mobile terminal of claim 1, further comprising:
    a case that is disposed to cover the printed circuit board and has a coupling hole corresponding to a boss; and
    a coupling member coupled to the boss through the coupling hole and configured to couple the case and the reinforcing member to each other.

12. A mobile terminal comprising:
    a window disposed on a surface of a terminal body;
    a liquid crystal display (LCD) disposed on a rear surface of the window and configured to output visual information through the window; and
    a frame formed in a curved shape and including a first frame part and a second frame part coupled to the first frame part, the first frame part including a window mounting portion, on which the window is mounted and to which at least part of the window is coupled,
    wherein the frame is configured to apply a bending force to conform the window to the curved shape of the frame and to cause the conformed window to bend the LCD adhered to the window when the window is attached to the frame,
    wherein the second frame part formed of a metal includes an outer frame part for covering at least part of side surfaces of the mobile terminal and an inner frame part for accommodating the LCD therein.

13. The mobile terminal of claim 12, wherein the first frame part formed of a synthetic resin includes first and second mounting surfaces to which the window is coupled,
    wherein the first mounting surface includes molded portions for having at least one of a sensor, a camera, a speaker, and a receiver disposed thereon, and
    wherein the second mounting surface includes a portion for having an antenna disposed thereon.

14. A mobile terminal comprising:
    a window disposed on a surface of a terminal body;
    a liquid crystal display (LCD) disposed on a rear surface of the window and configured to output visual information through the window;
    a frame formed in a curved shape and including a window mounting portion, on which the window is mounted and to which at least part of the window is coupled, wherein the frame accommodates the LCD therein; and
    an appearance-forming member coupled to the frame to surround an outer circumference of the frame and disposed to cover side surfaces of the window, so as to form a side appearance of the terminal body, wherein the frame is configured to apply a bending force to conform the window to the curved shape of the frame and to cause the conformed window to bend the LCD when the window is attached to the frame, wherein the appearance-forming member is formed in a curved shape to reinforce rigidity of the frame, wherein protrusions are formed at both sides of the frame in a widthwise direction of the frame and extend into a curved shape along a lengthwise direction of the frame, and wherein stopping slots are formed on an inner side surface of the appearance-forming member corresponding to the protrusions.

* * * * *